United States Patent [19]

Sasagawa

[11] Patent Number: 5,196,718
[45] Date of Patent: Mar. 23, 1993

[54] LIGHT-EMITTING DIODE ARRAY

[75] Inventor: Teruo Sasagawa, Kanagawa, Japan

[73] Assignee: Eastman Kodak Company, Rochester, N.Y.

[21] Appl. No.: 744,605

[22] Filed: Aug. 13, 1991

[30] Foreign Application Priority Data

Aug. 14, 1990 [JP] Japan .................................. 2-215232

[51] Int. Cl.$^5$ ............................................ H01L 33/00
[52] U.S. Cl. ......................................... 257/88; 257/96; 257/97; 257/99; 257/102; 257/510; 257/594; 257/773
[58] Field of Search ....................... 357/17, 16, 45, 49, 357/55, 68

[56] References Cited

U.S. PATENT DOCUMENTS

5,062,115  10/1991  Thornton .............................. 357/17

Primary Examiner—Edward J. Wojciechowicz
Attorney, Agent, or Firm—Raymond L. Owens

[57] ABSTRACT

A high efficiency, high density light-emitting diode array which provides improved light output efficiency and suppression of crosstalk between adjacent light-emitting elements without loss of reliability or reproducibility is disclosed. The array includes isolated light-emitting elements on a substrate. Each light-emitting element has a light-emitting layer between a pair of cladding layers with heterojunctions being formed between the light-emitting layer and the cladding layers. Each light-emitting element has a light-emitting surface and the light-emitting layer of each light-emitting element is of an area no greater than the area of the light-emitting surface.

22 Claims, 5 Drawing Sheets

LIGHT-EMITTING DIODE ARRAY

FIELD OF THE INVENTION

The present invention relates to a light-emitting diode array, and, more particularly, to a heterojunction light-emitting diode array for use as a printing light source in a optical printer and comprising a multiplicity of light-emitting diode closely arrayed on a single substrate.

BACKGROUND OF THE INVENTION

In recent years there is an increasing need for printers able to print faster and with a higher print density. Laser printers, which employ a laser light source, and LED (light-emitting diode) printers, which employ an LED array as the light source, are two examples of printers used in response to such needs. While a laser printer requires the use of a mechanical mechanism, such as a rotating polygonal mirror, for the scanning laser beam, with an LED printer it is only necessary for the light-emitting diodes (hereinafter also referred to as "light-emitting elements") that make up the light-emitting diode array to be electrically controlled. The advantages of LED printers compared with laser printers are that as they do not have any mechanical moving parts, they are smaller, faster and more reliable.

Figure 1:
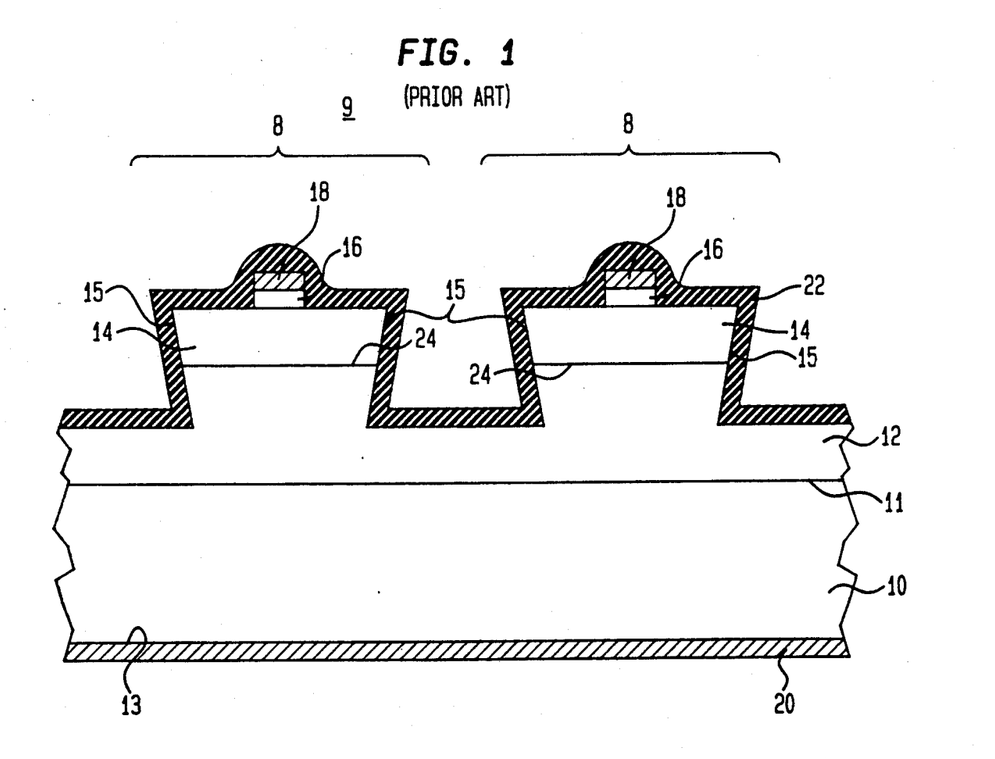
FIG. 1 is a cross-sectional view of a prior art AlGaAs single heterojunction light-emitting diode array.

Referring to FIG. 1, there is shown a cross-sectional view of two light-emitting elements 8 of a prior art AlGaAs-based homojunction LED array 9. The array 9 comprises a substrate 10 of p-type conductivity GaAs having on a surface 11 thereof a first layer 12 of p-type conductivity $Al_xGa_{1-x}As$. The first layer 12 is about 10 microns in thickness and is doped with Zn to a concentration of about $5 \times 10^{17}$ impurities/$cm^3$. On a surface 24 of the first layer 12 is a second layer 14 of n-type conductivity $Al_yGa_{1-y}As$ which is about 5 microns in thickness and is doped with Te to a concentration of about $8 \times 10^{17}$ impurities/$cm^3$. For emitting light with a wavelength in the region of 720 nm., the aluminum composition in the first and second layers 12 and 14 is set at $x=0.2$ and $y=0.5$. Spaced grooves 15 extend through the second layer 14 and a portion of the first layer 12 to form mesa like light-emitting elements 8.

A separate contact layer 16 of n+ type conductivity GaAs is on a portion of the second layer 14 of each light-emitting element 8. The contact layers 16 are about 0.1 microns in thickness and are doped with Sn to a concentration of about $5 \times 10^{18}$ impurities/$cm^3$. On each of the contact layer 16 is a separate electrode 18, and on a surface 13 of the substrate 10 is an electrode 20. An antireflection coating 22 of the $SiN_x$ covers the light-emitting elements 8 and the bottom of the grooves 15.

The array 9 is made by depositing on the surface 11 of the substrate 10 in succession using liquid-phase epitaxy (LPE), the first layer 12, the second layer 14 and a contact layer 16. The electrode layer 18 is deposited on the contact layer 16 and the electrode layer 20 is deposited on the surface 13 of the substrate 10. Using photolithography and plasma etching, the electrode layer 18 is defined to leave portions of the electrode layer 18 only over the area which is to form the light-emitting elements 8. Then using a chemical etchant of $NH_4OH:H_2O_2=1:10$, the contact layer 16 is removed except for the portions under the elecrodes 18. Using photolithography and a chemical etchant of $H_2SO_4:H_2O_2:H_2O=1:2:40$, the grooves 15 are etched through the second layer 14 and about one micron into the first layer 12 to form the light-emitting elements 8. Plasma CVD (chemical vapor deposition) is then used to form the antireflection $SiN_x$ coating 22. This is followed by alloying to form the electrodes 18 and 20.

Structurally, this heterojunction light-emitting diode array 9 consists of discrete high-luminance LEDs 8 arranged into a single array. Using the n-type conductivity $Al_yGa_{1-y}As$ second layer 14 that is transparent to the light emitted by the emission layer p-type conductivity $Al_xGa_{1-x}As$ first layer 12 results in energy attenuation from internal absorption being avoided. Also, an epitaxial junction with excellent crystallinity is employed, and the improvement in injection efficiency provided by the heterojunction raises the overall external emission efficiency.

However, unlike the case with single, discrete LEDs, there are the following problems with LED arrays used for printer applications. First, optical crosstalk between elements has to be suppressed; and second, variation in characteristics from element to element has to be minimized.

For this, in the light-emitting diode array 9 shown in FIG. 1, the n-type $Al_yGa_{1-y}As$ second layer 14 that forms a transparent window has to be completely removed between light-emitting elements 8. In addition, to reduce optical bleeding, the emission mesas have to be formed to a certain minimum depth into the p-type $Al_xGa_{1-x}As$ emission first layer 12.

The diffusion length of minority carrier electrons injected into the p-type $Al_xGa_{1-x}As$ first layer 12 decreases as the distance from the p-n junction increases, but is in the order of 10 microns. This means that at least about 10 microns of the p-type $Al_xGa_{1-x}As$ first layer 12 has to be removed. However, it is difficult to accomplish this with adequate process uniformity and reproducibility. Thus, some degree of optical bleeding has been unavoidable in the resultant LED arrays in which the fabrication process took such factors into account. Furthermore, the p-type $Al_xGa_{1-x}As$ first layer 12 that is within the diffusion length of electrons from the p-n junction 24 functions effectively as an emission layer. Thus, in order to optimize the emission efficiency, it is necessary to make the p-type $Al_xGa_{1-x}As$ first layer 12 at least 10 microns thick. A problem is, however, that even if the emission efficiency is improved, owing to the high refractive index of the light-emitting portion, most of the light is lost through total reflection. This results in a very low external light output efficiency of no more than several percent. One cause may be the loss of high-intensity light in the emission portion directly beneath the electrode 18, owing to the fact that the electrode is formed directly on the upper part of the emission portion.

SUMMARY OF THE INVENTION

The present invention is, therefore, to provide a high efficiency, high density light-emitting diode array in which light output efficiency is improved and crosstalk between adjacent light-emitting elements can be suppressed without any loss of reliability or reproducibility.

In accordance with the present invention, this is attained by an array of light emitting elements arranged in spaced isolated relation on a surface of a substrate. Each light-emitting element has a light-emitting layer of a material which emits light when carriers are injected therein. The light-emitting layer is between cladding layers each of a material having a wider band gap than that of the material of the light-emitting layer to form a heterojunction with the light-emitting layer. An electrode is over one of the cladding layers and extends around a light-emitting surface, and the light-emitting layer is of an area so as to lie wholly within the light-emitting surface.

The invention will be better understood from the following more detailed description taken with the accompanying drawings.

BRIEF DESCRIPTION OF THE DRAWINGS

The drawings are not necessarily drawn to scale.

DETAILED DESCRIPTION

Figure 2:
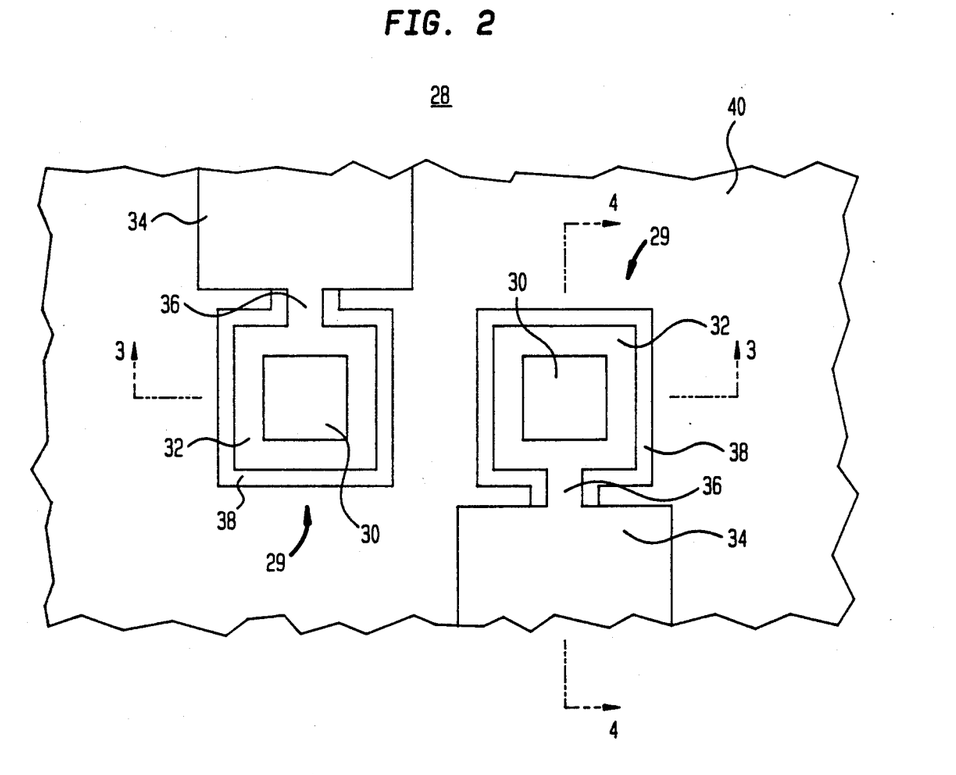
FIG. 2 is a top plan view of one form of a light-emitting diode array in accordance with the present invention.
Figure 3:
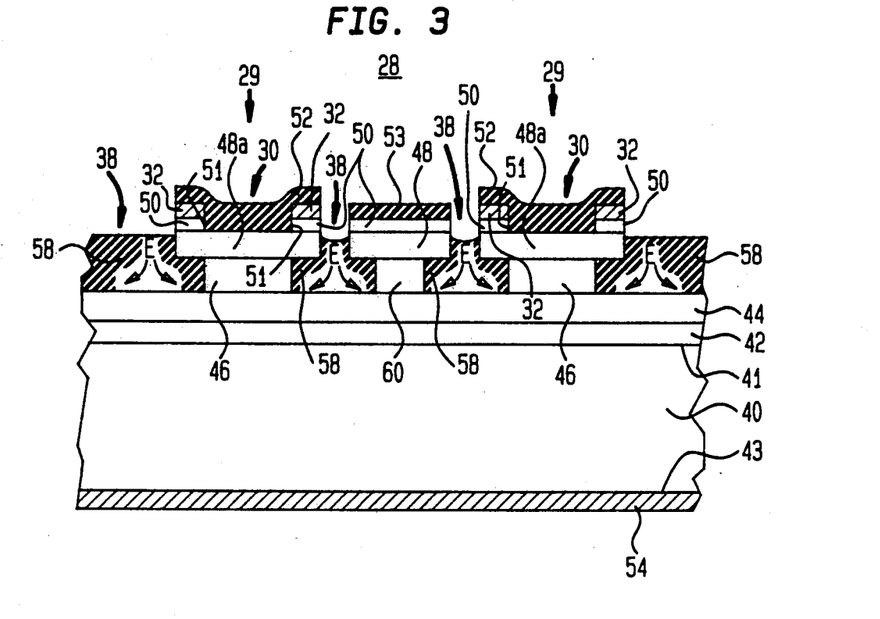
FIG. 3 is a cross-sectional view taken along line 3—3 of FIG. 2.
Figure 4:
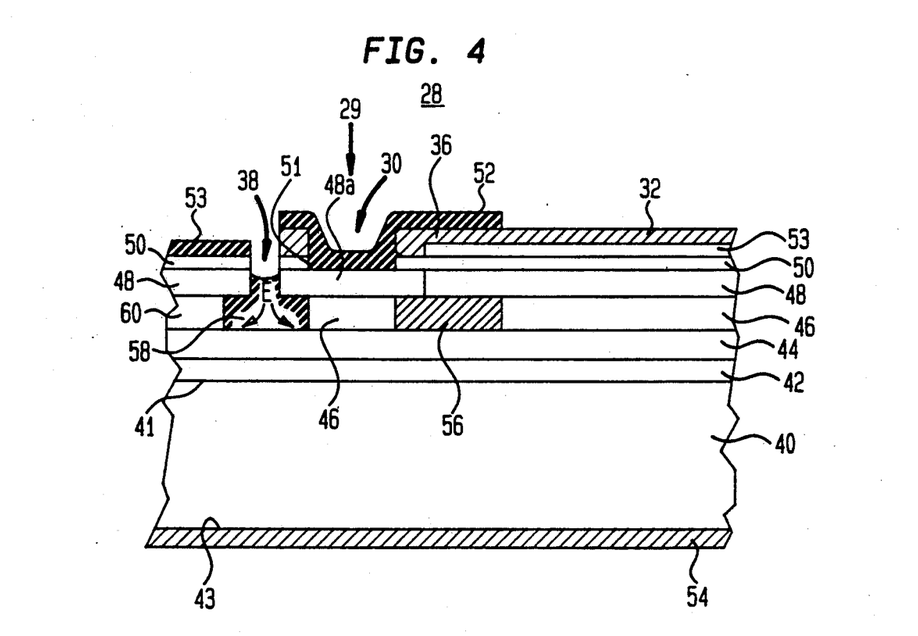
FIG. 4 is a cross-sectional view taken along line 4—4 of FIG. 2.

Referring now to FIGS. 2, 3 and 4, there is shown a top view (FIG. 2), a first cross-sectional view (FIG. 3) through a dashed line 3—3 of FIG. 1, and a second cross-sectional view (FIG. 4) through a dashed line 4—4 of FIG. 1 of a light-emitting diode array 28 having light-emitting elements 29. For simplicity, only two light-emitting elements 29 are shown.

As shown in FIGS. 3 and 4, the diode array 28 comprises a substrate 40 of n-type conductivity GaAs which is doped with Si to a concentration of about $1 \times 10^{18}$ impurities/$cm^3$. The substrate 40 has opposed surfaces 41 and 43. On the surface 41 is a buffer layer 42 of n-type GaAs of a thickness of about 0.2 microns and which is doped with Se to a concentration of about $1 \times 10^{18}$ impurities/$cm^3$. On the buffer layer 42 is a first cladding layer 44 of n-type conductivity $Al_xGa_{1-x}As$ which is about 2.0 microns in thickness and is doped with Se to a concentration of about $5 \times 10^{18}$ impurities/$cm^3$. A p-type conductivity light-emitting layer 46 of GaAs is on the first cladding layer 44. The light-emitting layer 46 is about 0.5 microns in thickness and is doped with Zn to a concentration of about $1 \times 10^{18}$ impurities/$cm^3$. On the light-emitting layer 46 is a second cladding layer 48 of n-type conductivity $Al_xGa_{1-x}As$ which is of a thickness of about 2.0 microns and is doped with Se to a concentration of about $5 \times 10^{18}$ impurities/$cm^3$. On the second cladding layer 48 is a contact layer 50 of n-type conductivity GaAs which is about 0.05 microns in thickness and is doped with Se to a concentration of about $5 \times 10^{18}$ impurities/$cm^3$. The cladding layers 44 and 48 are each of a material having a wider band gap than the material of the light-emitting layer 46. This forms a heterojunction between the light-emitting layer 46 and each of the cladding layers 44 and 48.

Trenches 38 extend through the contact layer 50, the second cladding layer 48 and the light-emitting layer 46 to form the light-emitting elements 29 which are connected to an electrode pad area 34 by a narrow feed through 36. In each light-emitting element 29, the contact layer 50 has an opening 51 therethrough to expose a light-emitting area 30. An electrode 32 is on each contact layer 50 of each light-emitting element 29 and extends over the feed through 36 to the electrode pad area 34. An electrode 54 is on the surface 43 of the substrate 40.

As is shown in FIG. 4, each of the trenches 38 extends under the second cladding layer 48 of its respective light-emitting element 39 a distance such that the light-emitting layer 46 of each light-emitting element 29 is no greater in area than the opening 51 in its respective contact layer 50. Thus, the light-emitting layer 46 of each light-emitting element 29 is no greater in area than the light-emitting area 30 of the light-emitting element 29. This provides a space 56 under the feed through 36. The space 56 and the rest of the trenches 38 are filled with a passivation layer 58. A p-type conductivity diffused region 48a extends through the second cladding layer 48 under each of the openings 51 in the contact layer 50 to the light-emitting layer 46. An antireflection layer 52 of $SiN_x$ is over the light-emitting area 30 of the second cladding layer 48 and a portion of the electrode 32 surrounding the opening 51 in the contact layer 50.

To make the light-emitting diode array 28, metal organic chemical vapor deposition (MOCVD) is used to epitaxially deposit on the substrate surface 41 in succession the buffer layer 42, the first cladding layer 44, the light-emitting layer 46, the second cladding layer 48 and the contact layer 50. Plasma CVD is then used to deposit a $SiN_x$ insulation layer 53 over the whole surface. Photolithography and plasma etching are used to etch away the portion of the $SiN_x$ layer 2 which is over the light-emitting portion 30. Zinc is then diffused into the light-emitting portion 30 as far as the light-emitting layer 46. The electrodes 32 and 54 are then formed by vapor deposition. The unnecessary portions of the electrode 32 are then removed by photolithography and plasma etching. Using the electrode 32 as a mask and $NH_4OH:H_2O_2 = 1:10$ chemical etching, the portions of the contact layer 50 which are not under the electrode 32 are then removed.

The antireflection $SiN_x$ layer 52 is then formed over the whole surface. Photolithography and plasma etching are then used to remove the antireflection $SiN_x$ layer 52 from the trench 38 portion around the light-emitting element 29 and feed through 36. $H_2SO_4:H_2O_2:H_2O = 1:2:40$ chemical etching is then used to remove the epitaxial layers of the trench 38 portion around the light-emitting element regions 29 down to the light-emitting layer 46. $NH_4OH:H_2O_2 = 1:10$ chemical etching is then used to remove just the portions of the light-emitting layer 46 between the cladding layers 44 and 48, in the way indicated by the arrows E in FIGS. 3 and 4. This etching is carried out until the emission layer 46 is smaller than the internal diameter of the electrode 32. Etching is continued until there is no light-emitting layer 46 below the electrode feed through 36. This forms the space 56 below the feed through 36 shown in FIG. 4.

Photolithography and plasma etching are then used to form the electrode bonding pad 34 by removing the $SiN_x$ layer from the electrode 32 pad portion. This is followed by the use of heat treatment to form ohmic contacts for the electrodes 32 and 50. Finally, polymide and oxygen reactive-ion etching is used to form a passivation layer 58 in the trenches 38 and along the side walls of the light-emitting layer 46.

In the light-emitting diode array 28, the thickness of the light-emitting layer 46, at 0.5 microns, can be made thinner than the light-emitting layer 12 of the prior art light-emitting diode array 9 shown in FIG. 1. If required, this thickness can be further decreased, to several hundred angstroms or less. The ability to decrease the thickness of the light-emitting layer 46 enables the carrier density in the emission region (light-emitting layer 46) to be raised, improving the internal efficiency. Also, making the layer 46 smaller than the internal diameter of the electrode 32 improves output efficiency, as the optical output is not hindered by the electrode 32. Contact resistance can be decreased by increasing the area of the electrode 32. Moreover, the second cladding layer 48 forms a bridge so that even after isolating the light-emitting portion 30, a conductive portion (feed through 36) can be formed on the flat portion between the electrode 32 and the electrode pad 34. This reduces problems of non-uniformity caused by a break in an electrode lead wire or the like. Also, crosstalk between adjacent elements can be suppressed by the provision of a light-absorbing wall 60, i.e., the portion of the light-emitting layer 46 not used as a light-emitting layer.

Figure 5:
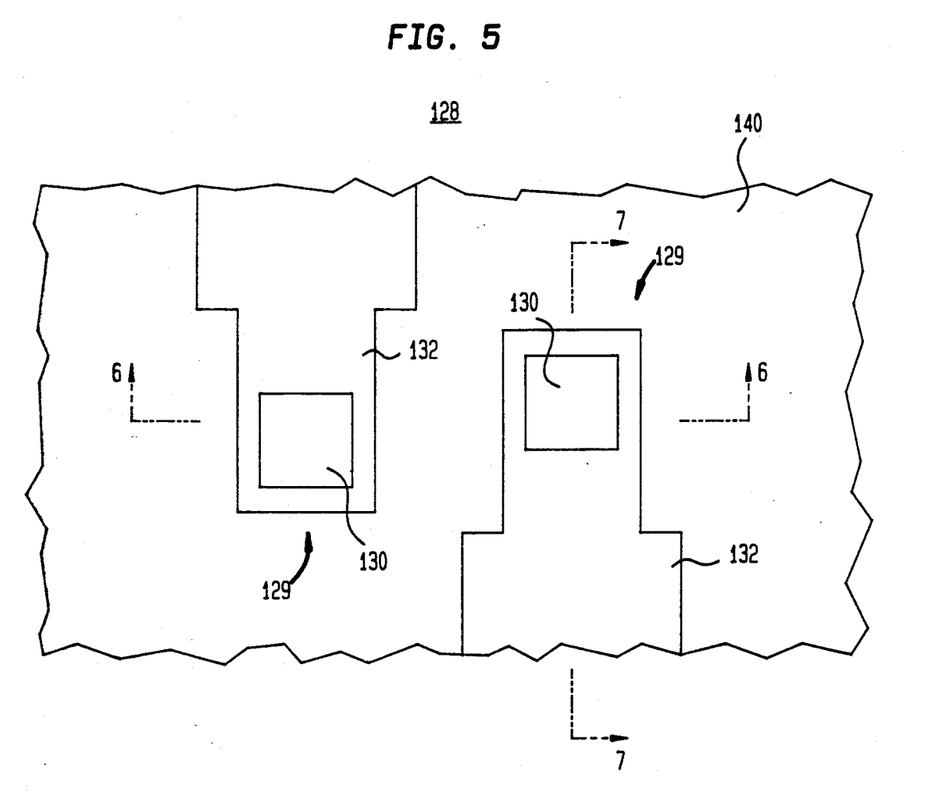
FIG. 5 is a top plan view of another form of a light-emitting diode array in accordance with the present invention.
Figure 6:
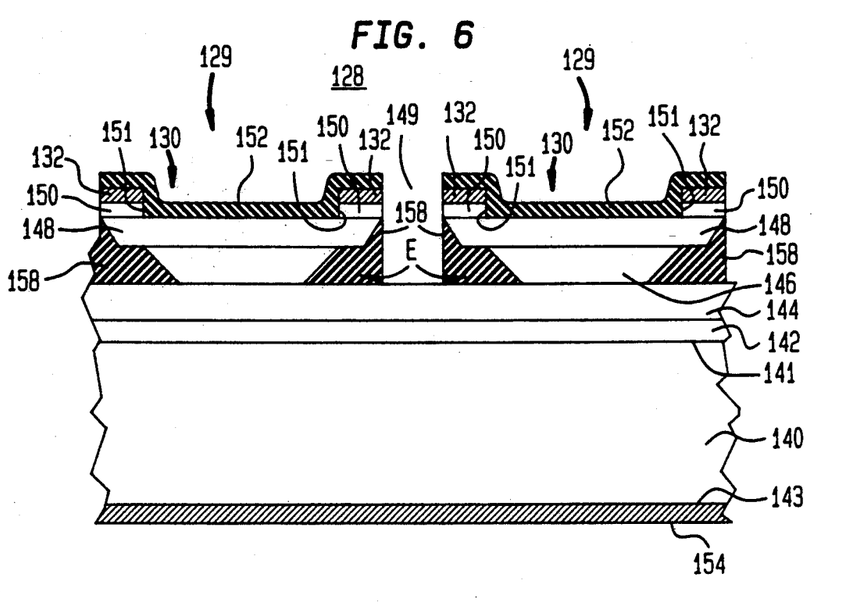
FIG. 6 is a cross-sectional view taken along line 6—6 of FIG. 5.
Figure 7:
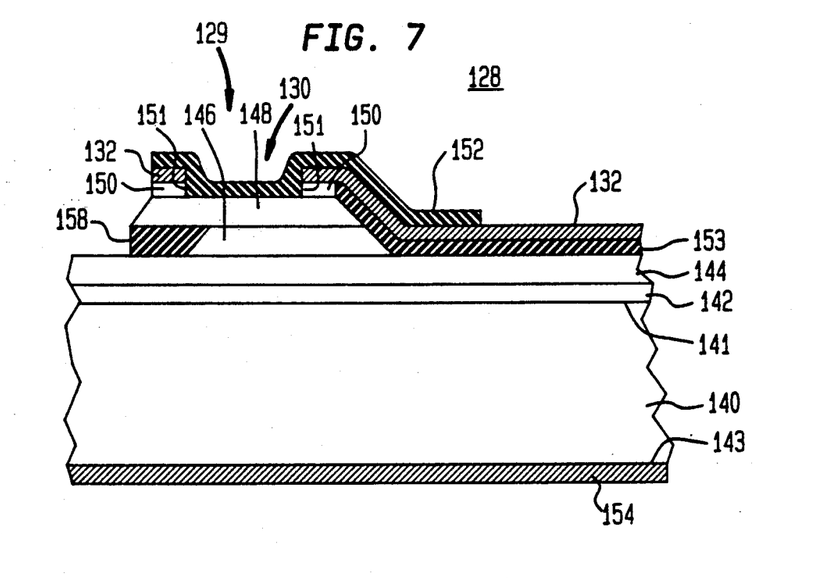
FIG. 7 is a cross-sectional view taken along line 7—7 of FIG. 5.

Referring now to FIGS. 5, 6 and 7, there is shown a top view (FIG. 5), a first cross-sectional view (FIG. 6) through a dashed line 6—6 of FIG. 5, and a second cross-sectional view (FIG. 7) through a dashed line 7—7 of FIG. 5 of a light-emitting diode array 128 in accordance with the present invention. For simplicity, again only two light-emitting elements 129 are shown. As shown in FIGS. 6 and 7, the light-emitting diode array 128 comprises a substrate 140 having opposed surfaces 141 and 143. The substrate 140 is of n-type conductivity GaAs which is doped with Si to a concentration of about $1 \times 10^{18}$ impurities/cm$^3$. On the surface 141 of the substrate 140 is a buffer layer 142 which is about 0.2 microns in thickness and is of n-type conductivity GaAs doped with Se to a concentration of about $1 \times 10^{18}$ impurities/cm$^3$. A first cladding layer 144 is on the buffer layer 142. The first cladding layer is of a thickness of about 2.0 microns and is of n-type conductivity $Al_xGa_{1-x}As$ doped with Se to a concentration of about $5 \times 10^{18}$ impurities/cm$^3$. On the first cladding layer 144 is a light-emitting layer 146 of p-type conductivity GaAs which is about 0.5 microns in thickness and doped with Zn to a concentration of about $1 \times 10^{18}$ impurities/cm$^3$. On the light-emitting layer 146 is a second cladding layer 148 of p-type conductivity $Al_xGa_{1-x}As$. The second cladding layer 148 is about 2.0 microns in thickness and is doped with Zn to a concentration of about $5 \times 10^{18}$ impurities/cm$^3$. A contact layer 150 is on the second cladding layer 148. The contact layer 150 is of p+ type conductivity GaAs which is about 0.05 microns in thickness and doped with Zn to a concentration of about $1 \times 10^{19}$ impurities/cm$^3$. To block carriers and transmit light at the emission wavelength of the GaAs light-emitting layer 146, the aluminum content is set at x=0.3. Each of the cladding layers 144 and 148 are of a material having a wider band gap than the material of the light-emitting layer 146. This forms a heterojunction between the light-emitting layer 146 and each of the cladding layers 144 and 148.

A recess 149 is provided through the contact layer 150, the second cladding layer 148 and the light-emitting layer 146 to form the light-emitting elements 129 in mesa like form. The contact layer 150 of each of the light-emitting elements 129 has an opening 151 therethrough to provide a light-emitting area 130 for each light-emitting element 129. An electrode 132 is on the contact layer 150 of each light-emitting element 129 and an electrode 154 is on the surface 143 of the substrate 140. The light-emitting layer 146 of each light-emitting element 129 is of an area no greater than the opening 151 in its respective contact layer 150. A passivation layer 158 is around each of the light-emitting layers 146 and an antireflective layer 152 of $SiN_x$ is over the light-emitting area 130 of the second cladding layer 148.

The light-emitting diode array 128 is made by depositing on the surface 141 of the substrate 140 in succession by MOCVD the buffer layer 142, the first cladding layer 144, the light-emitting layer 146, the second cladding layer 148 and the contact layer 150. Plasma CVD is then used to form an $SiN_x$ layer 153 over the whole surface and photolithography and plasma etching are used to remove the $SiN_x$ layer around the intended locations of the mesa formation that includes the light-emitting elements 129. $H_2SO_4:H_2O_2:H_2O = 1:8:16$ chemical etching is then used to remove the portions around the intended mesa formations down as far as the first cladding layer 144 to thereby form the light-emitting mesas 129.

The surface $SiN_x$ layer is removed with a weak solution of hydrofluoric acid and plasma CVD is then used to form an $SiN_x$ insulation layer 153 over the whole surface. Photolithography and plasma etching are then used again to remove the $SiN_x$ layer from the light-emitting mesa 129. Electrodes 132 and 154 are then formed by vapor deposition. The unnecessary portions of the electrode 132 are then removed by photolithography and plasma etching. $NH_4OH:H_2O_2=1:10$ chemical etching is then used to remove the contact layer 150 except for the portion under the electrode 132. The antireflection $SiN_x$ layer 152 is then formed by plasma CVD and the electrodes 132 and 154 are formed by alloying.

Photolithography and plasma etching are used to remove the $SiN_x$ antireflection layer around the mesa, and $NH_4OH:H_2O_2=1:10$ chemical etching is then used to remove the light-emitting layer 146 in the way indicated by the arrows E in FIG. 6 until the diameter of the light-emitting layer 146 (shown in FIG. 6) is no greater than, and preferably smaller than, the internal diameter of the electrode 132. Finally, polymide and oxygen reactive-ion etching is used to form a passivation layer 158 on the side wall of the light-emitting layer 146.

In the light-emitting diode array 128, optical output is improved because, as shown in FIG. 6, the light-emitting portion 130 is not covered by the electrode 132. Also, with reference to FIG. 6, forming the light-emitting layer 146 so that in cross-section it is in the shape of an inverted mesa means that light from adjacent elements is reflected downwards by the mesa side faces, and with all light emerging horizontally from the interior being reflected, crosstalk between adjacent elements is suppressed.

Thus, there is provided by the present invention a light-emitting diode array which provides for greater output of the light generated by each light-emitting element. Also, crosstalk between adjacent light-emitting elements is suppressed.

It is to be appreciated and understood that the specific embodiments of the invention are merely illustrative of the general principles of the invention. Various modifications may be made consistent with the principles set forth. For example, although the light-emitting diode arrays have been described with reference to specific thicknesses and compositions of AlGaAs and GaAs, it is to be understood that the invention is not limited thereto but includes the use of semiconductor substances having different compositions and etched to different thicknesses. Still further, although MOCVD has been described as being used to deposit the various layers of the arrays, other epitaxial processes may be used such as GSMBE, MBE, CBE and LPCVD.

What is claimed is:

1. A light emitting diode array comprising:
    a substrate having a surface;
    a plurality of light-emitting elements is spaced isolated relation on the substrate surface, each of the light-emitting elements comprising:
    a light-emitting layer of a material which will emit light by the injection of carriers;
    first and second cladding layers at opposite sides of the light-emitting layer so that the first cladding layer is between the light-emitting layer and the substrate surface and the second cladding layer is over the light-emitting layer, each of the cladding layers being of a material having a wider band gap than the material of the light-emitting layer so as to form a heterojunction therebetween;
    an electrode over the second cladding layer and extending in an enclosed path around a light-emitting surface portion of the second cladding layer; and
    the light-emitting layer being wholly within the light-emitting surface of the second cladding layer.

2. The light-emitting diode array of claim 1 further comprising a trench extending through the second cladding layer and the light-emitting layer, said trench extending around each of the light-emitting elements so as to define the light-emitting elements and to isolate the light-emitting elements from each other.

3. The light-emitting diode array of claim 2 further comprising an insulating material in the trench and around the light-emitting layer of each light-emitting element.

4. The light-emitting diode array of claim 1 in which each electrode extends over the second cladding layer of the light-emitting element and has an opening therethrough to expose the light-emitting surface.

5. The light-emitting diode array of claim 4 in which the second cladding layer and the electrode of each of the light-emitting elements have an electrode pad portion connected to the light-emitting element by a narrower feed through region, and the trench extends under the feed through region.

6. The light-emitting diode array of claim 5 in which the light-emitting layer of each light-emitting element has side walls which taper toward each other from the second cladding layer to the first cladding layer so as to reflect light from adjacent light-emitting elements away from the respective light-emitting element.

7. The light-emitting diode array of claim 1 wherein the cladding layers are of one conductivity type and the light-emitting layer is of a conductivity type opposite that of the cladding layers, and a region of the same conductivity type as the light-emitting layer extends through the second cladding layer from the electrode to the light-emitting layer.

8. A light emitting diode array of claim 1 wherein the first cladding layers are each of a conductivity type opposite to that of the second cladding layers and the light-emitting layer is of the same conductivity type as one of the cladding layers.

9. A light-emitting diode array comprising:
    a substrate of one conductivity type having opposed surfaces;
    a first cladding layer of the one conductivity type over one of the surfaces of the substrate;
    a light-emitting on the first cladding layer, the light-emitting layer being of a material which will emit light by the injection of carriers and of a conductivity type opposite that of the first cladding layer;
    a second cladding layer on the light-emitting layer;
    the cladding layers being of a material having a wider band gap than the material of the light-emitting layer;
    means for isolating a portion of the second cladding layer and the light-emitting layer from other portions thereof to form separate light-emitting elements isolated from each other, the second cladding layer of each of the light-emitting elements having a light emitting surface with the light-emitting layer of each of the light-emitting elements being of an area no greater than the area of the light-emitting surface;
    a first electrode on the second cladding layer and extending around the light-emitting surface; and
    a second electrode on the other surface of the substrate.

10. The light-emitting diode array of claim 9 in which the means isolating the light-emitting elements comprises a trench extending through the second cladding layer and the light-emitting layer and around the light-emitting element, the trench extending under the second cladding layer so that the light-emitting layer is smaller in area than the second cladding layer.

11. The light-emitting diode array of claim 10 in which the first electrode of each light-emitting element extends over the second cladding layer and has an opening therethrough exposing the light-emitting surface.

12. The light-emitting diode array of claim 11 in which the second cladding layer and the first electrode of each light-emitting element have an electrode pad region connected to the light-emitting element by a narrower feed through region, an the trench extends under the feed through region.

13. The light-emitting diode array of claim 12 further comprising an insulating material substantially filling the trench except for the portion which extends under the feed through region.

14. The light-emitting diode array of claim 13 wherein the cladding layers are both of the same conductivity type, and a region of the same conductivity type as the light-emitting layer extends through the second cladding layer to the light-emitting layer.

15. The light-emitting diode array of claim 14 in which the one conductivity type is n-type and the opposite conductivity type is p-type.

16. The light-emitting diode array of claim 15 in which the substrate and the light-emitting layer are of GaAs and the cladding layers are of AlGaAs.

17. The light-emitting diode array of claim 9 in which the means isolating the light-emitting elements is a groove extending through the second cladding layer and the light-emitting layer, the groove extends under the second cladding layer so that the light-emitting layer of each light-emitting element is smaller in area than the second cladding layer of each light-emitting element.

18. The light-emitting diode array of claim 17 in which an insulating material is in the groove and around the light-emitting layer of each of the light-emitting elements.

19. The light-emitting diode array of claim 18 in which the light-emitting layer of each light-emitting element has side walls which taper toward each other from the second cladding layer to the first cladding layer so as to reflect any light from adjacent light-emitting elements away from the respective light-emitting element.

20. The light-emitting diode of array of claim 19 wherein the second cladding layer is of the same conductivity type as the light-emitting layer.

21. The light-emitting diode array of claim 20 in which the one conductivity type is n-type and the opposite conductivity type is p-type.

22. The light-emitting diode array of claim 21 in which the substrate and the light-emitting layer are of GaAs and the cladding layers are of AlGaAs.

* * * * *